US009716031B2

(12) United States Patent
Killingsworth (10) Patent No.: US 9,716,031 B2
(45) Date of Patent: *Jul. 25, 2017

(54) SEMICONDUCTOR WAFER AND METHOD OF CONCURRENTLY TESTING CIRCUITS FORMED THEREON (71) Applicant: FREESCALE SEMICONDUCTOR, INC., Austin, TX (US)

(72) Inventor: Dewey Killingsworth, Shah Alam (MY)

(73) Assignee: NXP USA, INC., Austin, TX (US)

(*) Notice: Subject to any disclaimer, the term of this patent is extended or adjusted under 35 U.S.C. 154(b) by 375 days.

This patent is subject to a terminal disclaimer.

(21) Appl. No.: 14/247,264

(22) Filed: Apr. 8, 2014

(65) Prior Publication Data
US 2015/0287655 A1 Oct. 8, 2015

(51) Int. Cl.
G01R 31/20 (2006.01)
H01L 21/768 (2006.01)
G01R 31/28 (2006.01)
H01L 21/66 (2006.01)

(52) U.S. Cl.
CPC ........ *H01L 21/768* (2013.01); *G01R 31/2884* (2013.01); *H01L 22/32* (2013.01); *H01L 2224/05553* (2013.01)

(58) Field of Classification Search
CPC G01R 31/26; G01R 31/2831; G01R 31/2858; G01R 31/2884; G01R 31/2887; G01R 31/2891; G01R 31/2893; G01R 31/318513

USPC ............ 324/750.16, 757.03, 762.03, 762.06
See application file for complete search history.

(56) References Cited

U.S. PATENT DOCUMENTS

| 4,768,883 | A | 9/1988 | Waldo | |
|---|---|---|---|---|
| 6,479,320 | B1 * | 11/2002 | Gooch | B81B 7/007 438/106 |
| 6,563,330 | B1 | 5/2003 | Maruyama | |
| 7,009,412 | B2 | 3/2006 | Chong | |
| 7,061,256 | B2 * | 6/2006 | Hasegawa | G01R 27/205 324/719 |
| 7,504,840 | B2 * | 3/2009 | Arat | G01R 1/06733 324/755.05 |
| 7,821,283 | B2 | 10/2010 | Yamada | |
| 7,847,568 | B2 | 12/2010 | Gangosa | |
| 8,471,588 | B2 | 6/2013 | Matsuda | |
| 9,146,273 | B2 * | 9/2015 | Pagani | G01R 31/2884 |
| 2002/0017914 | A1 * | 2/2002 | Roggel | G01R 1/06738 324/754.2 |
| 2002/0157082 | A1 * | 10/2002 | Shau | G01R 31/2856 716/50 |
| 2006/0022689 | A1 * | 2/2006 | Golden | G01R 1/06783 324/754.04 |
| 2009/0189299 | A1 * | 7/2009 | Miranda | H01L 22/14 257/782 |

(Continued)

Primary Examiner — Giovanni Astacio-Oquendo
(74) Attorney, Agent, or Firm — Charles E. Bergere (57) ABSTRACT A semiconductor wafer has a non-uniform array of integrated circuit dies formed on it. Each die is enclosed by a respective seal ring, and each die has a group of bond pads and probe pad coupled to the bond pads. Common electrical interconnects selectively electrically couple together respective probe pads of each of the dies. The common electrical interconnects allow the dies to be tested concurrently before being cut from the wafer.

20 Claims, 7 Drawing Sheets (56) References Cited

U.S. PATENT DOCUMENTS

2015/0287655 A1* 10/2015 Killingsworth ....... H01L 21/768
324/762.02

* cited by examiner

SEMICONDUCTOR WAFER AND METHOD OF CONCURRENTLY TESTING CIRCUITS FORMED THEREON

BACKGROUND OF THE INVENTION

The present invention relates generally to semiconductor wafers, and, more particularly, to a method of testing in parallel the integrated circuits formed on the wafer.

Figure 1A:
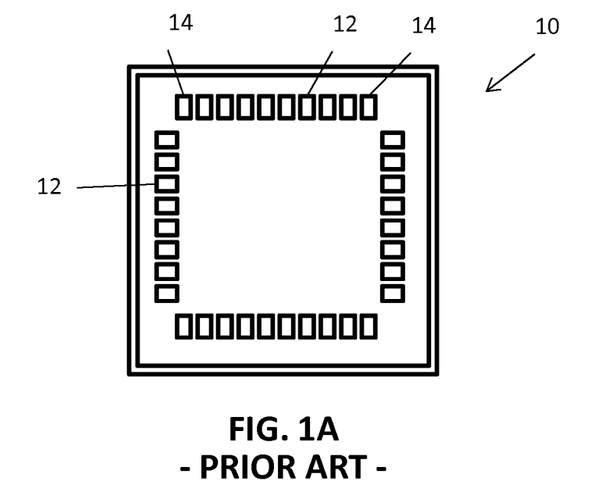
FIG. 1A is a simplified plan view of a conventional integrated circuit.

In the design and fabrication of integrated circuits, individual circuits are designed used Electronic Design Automation (EDA) tools. When a design is completed (logic design, layout, simulation, etc.), the design is taped out, which means the design is saved in a form that can be used by a wafer fabrication facility to form an integrated circuit of the design on a semiconductor wafer. FIG. 1A is a simplified plan view of an example of an integrated circuit 10 that has been taped out. The integrated circuit 10 includes a plurality of input and output (I/O) pads 12, which includes power and ground pads, as is known in the art.

Figure 1B:
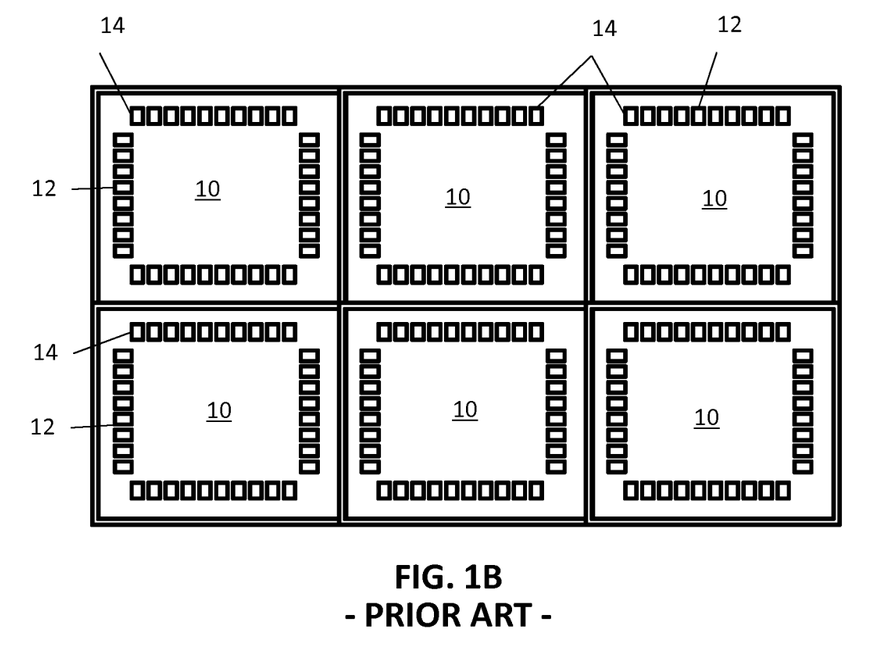
FIG. 1B is a partial plan view of a semiconductor wafer showing how multiple ones of the conventional integrated circuit of FIG. 1A are formed on a semiconductor wafer.

After the design is taped out, multiple instances of the circuit 10 are formed on a semiconductor wafer, with the individual instances known as dies. FIG. 1B shows a plurality of the integrated circuits 10 or dies as are typically manufactured with an array of identical dies formed on the wafer. The integrated circuits 10 include I/O or bond pads 12 and probe pads 14 that are used for testing the integrated circuits 10.

Figure 1C:
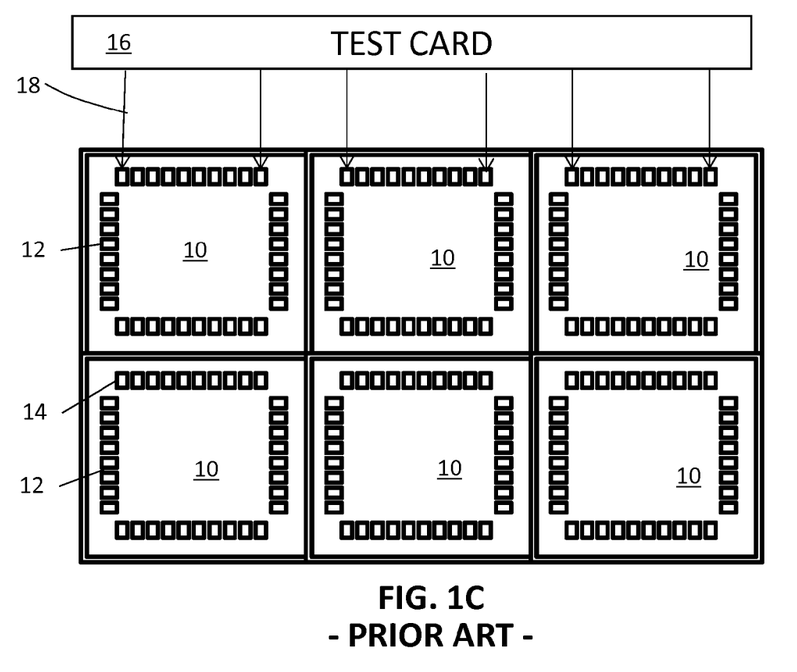
FIG. 1C is a partial plan view of a semiconductor wafer showing how multiple ones of the conventional integrated circuit of FIG. 1A are tested.

Once fabricated, the dies are preliminary tested to identify potentially fault free dies from defective dies. For convenience, such preliminary tests are performed before separating the dies from each other by dicing. As shown in FIG. 1C, these preliminary tests are performed using a test card 16 having probes (pins) 18, with the probes 18 being placed in contact with the probe pads 14 on the integrated circuits 10.

Probe testing is inherently slow because it is a physical process in which the probes 18 are serially moved from test pads 14 on each die 10 to perform a sequence of tests. Testing times have been reduced by testing multiple dies on the wafer in parallel by using test cards with sets of probes. FIG. 1C shows 3 dies being tested at the same time. However, parallel testing of dies is becoming more complex as the number of die bond pads increases and probe pads get smaller. The industry has been addressing these issues by adding more probe pins and tester channels to the testers. However, more complexity and more tester channels equates to higher cost.

Therefore, it is an object of the present invention to reduce the time required to test the dies formed on a wafer prior to dicing.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor wafer having a non-uniform array of identical integrated circuits formed thereon. Each of the integrated circuits is enclosed with a respective seal ring, and each of the circuits includes a group of bond pads and a plurality of probe pad selectively coupled to respective ones of the bond pads. A common electrical interconnect selectively electrically couples together a respective one of the probe pads of an integrated circuit with one of the probe pads of an adjacent integrated circuit.

In another embodiment, the present invention provides a method of concurrently testing an array of identical integrated circuits formed on a semiconductor wafer. Each of the integrated circuits is enclosed by a respective seal ring, and each of the circuits has a group of bond pads and a plurality of probe pads selectively coupled to ones of the bond pads. Common electrical interconnects selectively electrically couple together respective ones of the probe pads on each of the integrated circuits. The method comprises selectively coupling test probes to the probe pads and selectively supplying input test patterns to the test probes to thereby concurrently supply the input test patterns to all of the integrated circuits in the array. Output test patterns from the test probes are processed in response to the input test patterns. The output test patterns are received by one or more of the test probes to determine if any of the integrated circuits are faulty.

In a further embodiment, the present invention provides a method of assembling a packaged semiconductor die. The method includes providing a semiconductor wafer with an array of identical integrated circuits formed on the wafer. Each of the integrated circuits is enclosed by a respective seal ring, and each of the circuits has a group of bond pads and a plurality of probe pads selectively coupled to ones of the bond pads. Common electrical interconnects selectively electrically couple together respective probe pads on each of the integrated circuits. Also, each of the integrated circuits has at least one die test pad that is electrically isolated from all of the other integrated circuits. The method provides for testing concurrently each of the integrated circuits with input test patterns. The input test patterns are applied to the probe pads to identify which integrated circuits are fault free. A process of cutting or dicing one of the fault free integrated circuits from the wafer to provide a semiconductor die enclosed by a seal ring is performed. Thereafter the semiconductor die is attached to a substrate and the bond pads of the die are electrically connected to external package connectors of the substrate. The substrate, die, and electrical connections then are enclosed in a protective housing.

In yet another embodiment, the present invention provides a tape-out design that includes a plurality of identical integrated circuit designs, each of the integrated circuit designs having a plurality of input and output pads and a plurality of probe pads including first and second probe pads. The first probe pads of the integrated circuit designs are connected in series, and the second probe pads of the integrated circuit designs are connected in series. Also, each of the integrated circuit designs is surrounded by a seal ring. Thus, instead of taping out a single integrated circuit design, according to the present invention, a plurality of integrated circuit designs having their respective probe pads connected in series is taped out so that the fabrication facility manufactures wafers having individual dies that have their probe pads connected in series, which allows for concurrent testing of the dies fabricated on a wafer.

Figure 2:
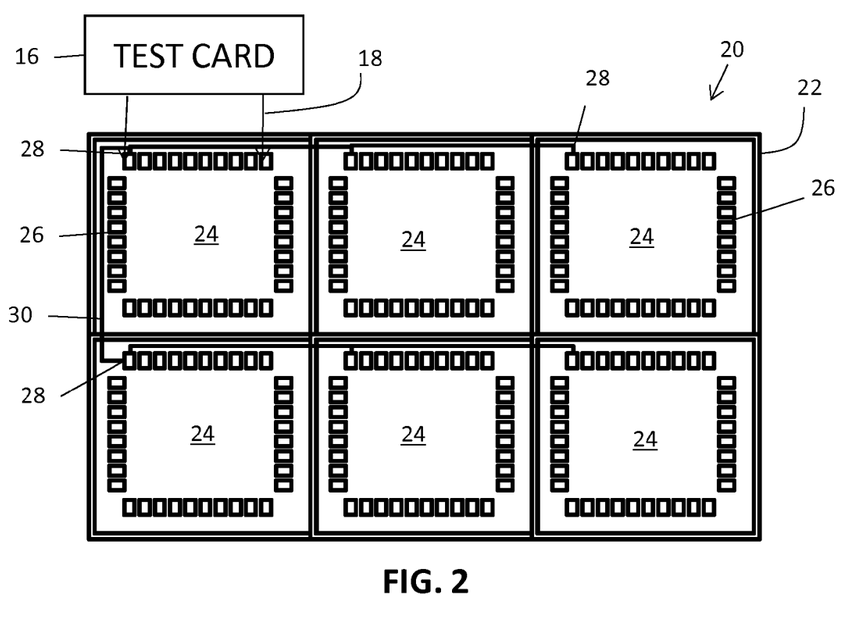
FIG. 2 is a partial plan view of a semiconductor wafer illustrating how multiple integrated circuits in accordance with the present invention are concurrently tested.

Referring now to FIG. 2, a partial plan view of a semiconductor wafer 20 in accordance with an embodiment of the present invention is shown. The wafer 20 has one or more arrays 22 of identical integrated circuit dies 24 formed thereon. FIG. 2 shows just one 2×3 array. Each of the dies 24 is separated by a sealing ring, as is known in the art. Each die 24 includes bond pads 26 and probe pads 28, also as are known in the art. However, according to the present invention, respective ones of the probe pads 28 of adjacent dies are connected in series, one to another, with an interconnect 30 that traverses the dies 24 and seal rings, as will be discussed in more detail below. The present invention allows the dies 24 to be concurrently tested using the test card 16 and probes 18. However, as can be seen, multiple dies can be tested using fewer probes than necessary in the conventional die testing.

Figure 3:
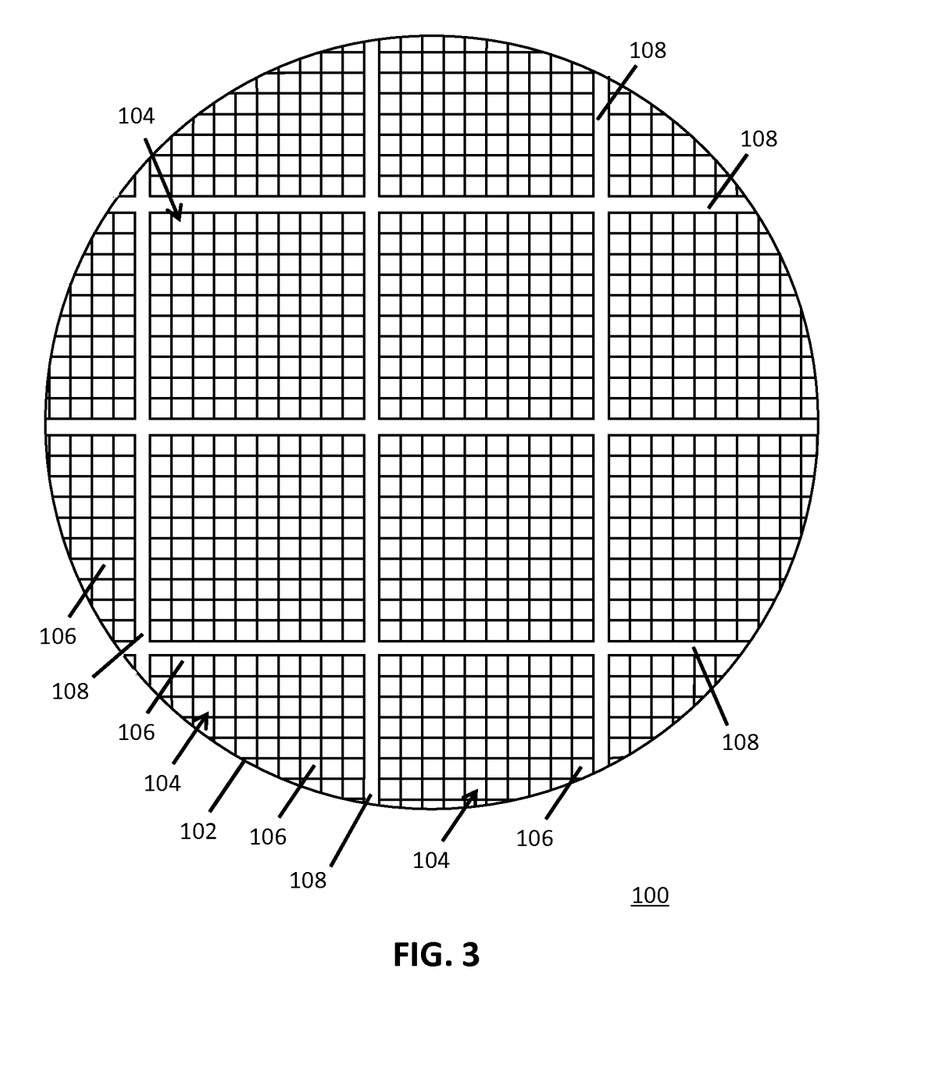
FIG. 3 is a plan view of a semiconductor wafer according to a general embodiment of the present invention.

FIG. 3 is a plan view of a semiconductor wafer 100 according to a general embodiment of the present invention is shown. The semiconductor wafer 100 includes a semiconductor substrate 102 with a plurality of array areas, each of the array areas being an array 104 of identical fabricated integrated circuits 106 formed on the semiconductor substrate 100. In this embodiment each array 104 is spaced from adjacent arrays 104 by array boundary regions 108, however in other embodiments there may not necessarily be a need for such spacing. Also, as can be seen, some of the arrays 104 are uniform in size (e.g., 10×10), while others, especially those adjacent to an edge of the substrate, may be non-uniform (e.g., 10×n, where n varies from 1 to 10, for example).

Figure 4:
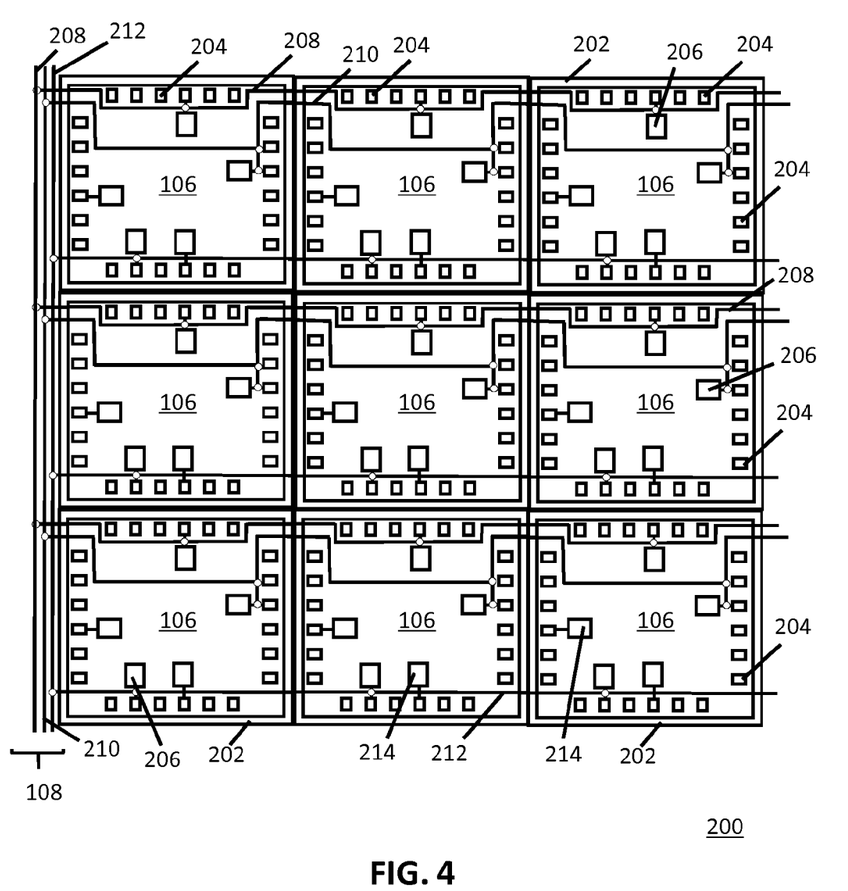
FIG. 4 is a detailed plan view of part of one array of integrated circuits formed on the wafer of FIG. 1 according to a first embodiment of the present invention.

FIG. 4 is a detailed plan view of part of one array 200 of the integrated circuits 106 formed on the wafer 100, according to a first embodiment of the present invention. As shown, each of the integrated circuits 106 is enclosed by a respective seal ring 202. There are a group of bond pads 204 and there are probe pads 206 that are coupled to a respective one of the bond pads 204. As will be apparent to a person skilled in the art, the probe pads 206 and bond pads 204 are located on an active surface of each of the integrated circuits 106.

As shown, the probe pads 206 are at identical locations on each of the integrated circuits 106. Furthermore, there is a first common electrical interconnect 208 that selectively electrically couples together a respective probe pad 206 of each of the integrated circuits 106 in the array 200. In this embodiment the first common electrical interconnect 208 is one of a plurality of common interconnections 208, 210, 212 typically on the active side of each of the integrated circuits 106. These common interconnections 208, 210, 212 selectively electrically couple together corresponding probe pads 206 on each of the integrated circuits 106 in the array 200.

Each of the integrated circuits 106 in the array 200 has at least one die test pad 214 coupled to one of the electrodes 204 in which the die test pad 214 is electrically isolated from all other integrated circuits 106. In this embodiment there are two such die test pads 214, 216. However, there may be many more such pads depending on the complexity of the semiconductor circuits 106 and required probe test patterns as described below. Further, in this embodiment, to provide interconnection to all corresponding probe pads 206 in the array 200, vertical lengths of the common interconnections 208, 210, 212 run along a side of the array 200 in one of the boundary regions 108.

Figure 5:
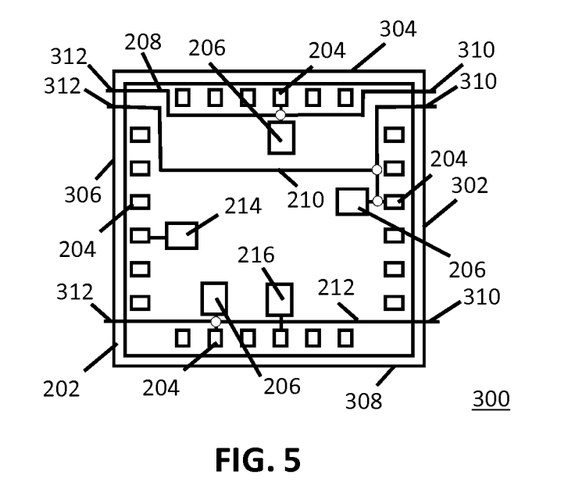
FIG. 5 is a plan view of a single semiconductor die circuit which is one of the integrated circuits of FIG. 2 according to the first embodiment of the present invention.

FIG. 5 is a plan view of a single semiconductor die circuit 300, which is one of the integrated circuits 106, according to the first embodiment of the present invention. As shown, the seal ring 202 is rectangular and therefore provides a rectangular boundary of four boundary edges 302, 304, 306, 308 and each common electrical interconnect 208, 210, 212 includes two interface runner regions 310, 312 extending past a respective boundary edge. More specifically, in this embodiment interface runner regions 310 cross and extend past the boundary edge 302 and interface runner regions 312 cross and extend past the boundary edge 306. It will also be apparent to a person skilled in the art that each interface runner region 310 is positioned to be aligned with and coupled to an interface runner region 312 on an adjacent one of integrated circuits 106 in the array 200.

Figure 6:
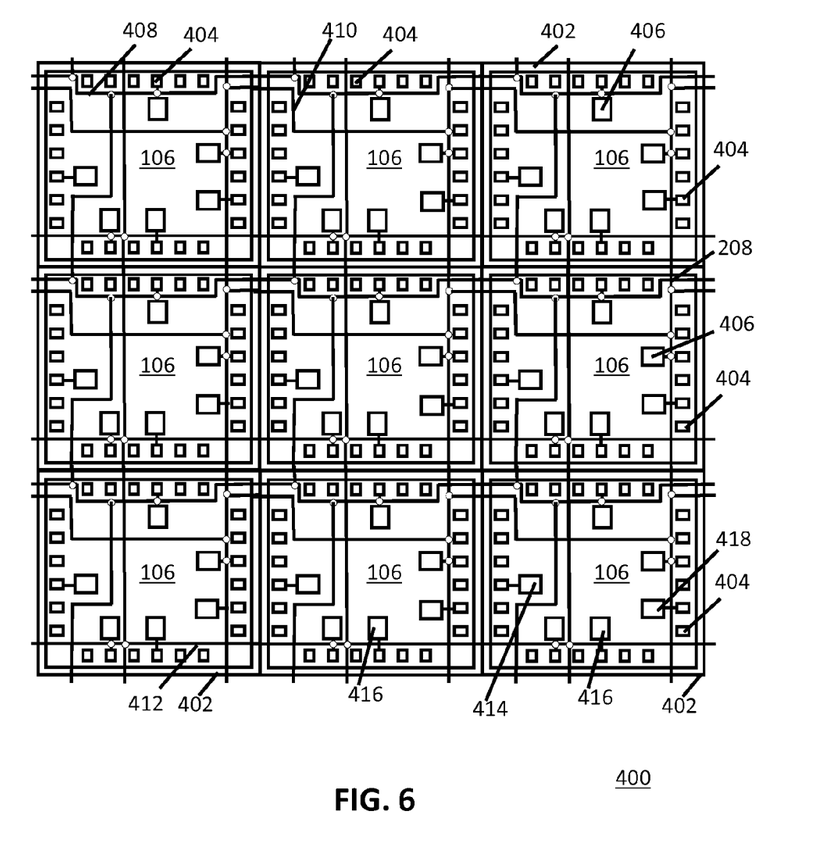
FIG. 6 is a detailed plan view of part of one array of integrated circuits formed on the wafer of FIG. 1 according to a second embodiment of the present invention.

FIG. 6 is a detailed plan view of part of one array 400 of the integrated circuits 106 formed on the wafer 100, according to a second embodiment of the present invention. Each of the integrated circuits 106 is enclosed by a respective seal ring 402. There are a group of bond pads 404 and there are probe pads 406 that are coupled to a respective one of the bond pads 404. As will be apparent to a person skilled in the art, the probe pads 406 and bond pads 404 are located on an active surface of each of the integrated circuits 106.

As shown, the probe pads 406 are at identical locations on each of the integrated circuits 106. Furthermore, there is a first common electrical interconnect 408 that selectively electrically couples together a respective probe pad 406 of each of the integrated circuits 106 in the array 400. In this second embodiment the first common electrical interconnect 408 is one of a plurality of common interconnections 408, 410, 412 typically on the active side of each of the integrated circuits 106. These common interconnections 408, 410, 412 selectively electrically couple together corresponding probe pads 406 on each of the integrated circuits 106 in the array 400.

Each of the integrated circuits 106 in the array 400 has at least one die test pad 414 coupled to one of the electrodes 404 in which the die test pad 414 is electrically isolated from all other integrated circuits 106. In this second embodiment there are three such die test pads 414, 416, 418. However, there may be many more such pads depending on the complexity of the semiconductor circuits 106 and required probe test patterns as described below. Furthermore, as will be apparent to a person skilled in the art, in this particular embodiment there is no need for each array 400 to be spaced by the boundary regions 108.

Figure 7:
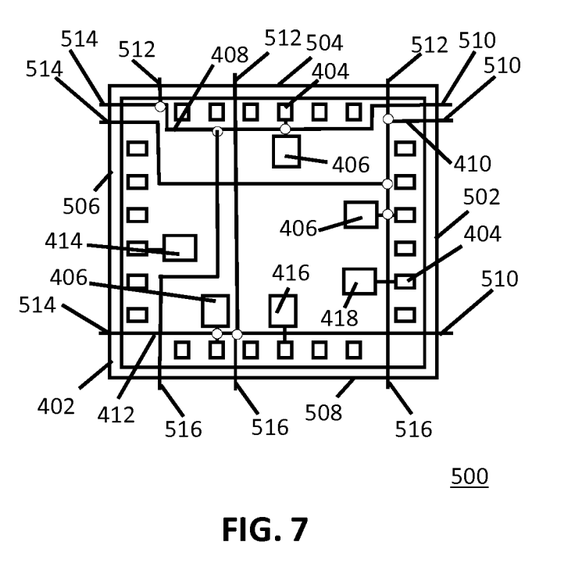
FIG. 7 is a plan view of a single semiconductor die circuit which is one of the integrated circuits of FIG. 4 according to the second embodiment of the present invention.

Referring to FIG. 7, a plan view of a single semiconductor die circuit 500, which is one of the integrated circuits 106, according to the first embodiment of the present invention, is shown. As shown, the seal ring 402 is rectangular and therefore provides a rectangular boundary of four boundary edges 502, 504, 506, 508 and each common electrical interconnect 408, 410, 412 includes four interface runner regions 510, 512, 514, 516 extending past a respective boundary edge. More specifically, in this embodiment interface runner regions 510 cross and extend past the boundary edge 502, interface runner regions 512 cross and extend past the boundary edge 504, interface runner regions 514 cross and extend past the boundary edge 506, and interface runner regions 516 cross and extend past the boundary edge 508. It will also be apparent to a person skilled in the art that each interface runner region 510 is positioned to be aligned with and coupled to an interface runner region 514 on an adjacent one of integrated circuits 106 in the array 400. Similarly, each interface runner region 512 is positioned to be aligned with and coupled to an interface runner region 516 on an adjacent one of integrated circuits 106 in the array 400.

Figure 8:
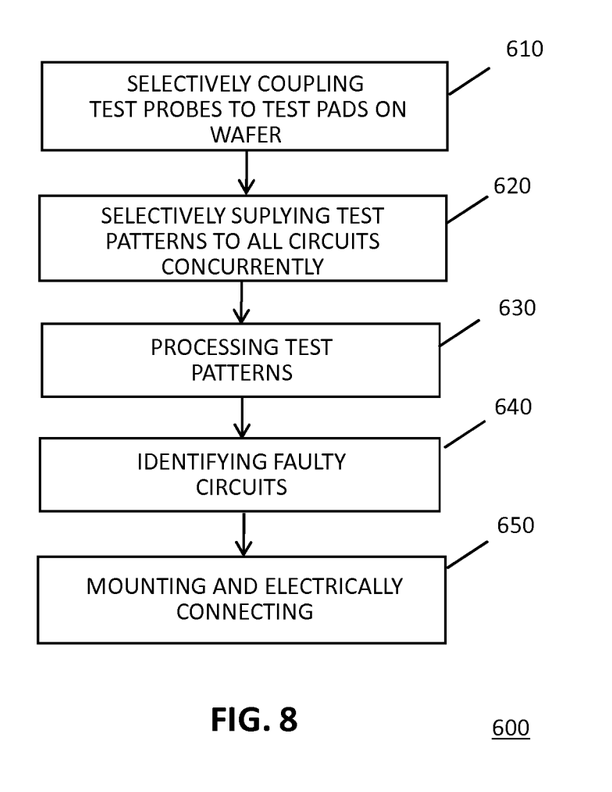
FIG. 8 is a flow chart of a method of testing the array 1 of identical fabricated semiconductor circuits, and thereafter assembling a packaged semiconductor die, according to a third embodiment of the present invention.

Referring to FIG. 8, a flow chart of a method 600 of testing each array of identically fabricated semiconductor circuits 106, and thereafter assembling a packaged semiconductor die, according to a third embodiment of the present invention, is shown. The method 600 will be described, by way of illustration only, with reference to the array 400 and semiconductor die circuit 500. The method 600 at a block 610 performs a process of selectively coupling test probes of an automatic test station to the probe pads 406. In this regard only one test probe is required to be coupled to a each of the common interconnections 408, 410, 412 at a single probe pads 406. Thus, since in this example there are only three common interconnections 408, 410, 412 then only three test probes are required for coupling to the probe pads 406. Typically, the probe pads 406 of a single semiconductor die circuit 500 are used for the coupling of the probe pads 406. However, the coupling of the three probe pads 406 may be distributed across several integrated circuits 500. It will be apparent to a person skilled in the art that in one embodiment the selectively coupling includes concurrently coupling of some of the test probes to a respective die test pad 414, 416 of each of the integrated circuits 500 in the array 400.

At block 620, a process of selectively supplying input test patterns to the test probes is performed, thereby concurrently supplying the input test patterns to all the semiconductor circuits 106 in the array 400. The test patents may include instructions to configure each of the integrated circuits 500 to perform scan path testing, built in self-testing or any other form of sequential or combinational logic test strategies as will be apparent to a person skilled in the art.

Output test patterns from the test probes are processed at a block 630. These test output patterns are received by one or more of test probes to thereby identify which, if any, of the integrated circuits 500 are faulty. In order to identify which, if any, of the integrated circuits 500 are faulty. More specifically, the selectively coupling, at block 610, includes coupling of some of the test probes to the die test pads 414, 416, 418 and the selectively supplying of the input test patterns to the probe pads 406 and die test pads 414, 416, 418 is performed concurrently. Furthermore, at least one of the die test pads 414, 416 of each of the integrated circuits 500 is used to supply the output test patterns to the test probes. This therefore allows for each of the integrated circuits 500 can be tested concurrently.

After completion of the method 600, each of the of the integrated circuits 500 has been tested with input test patterns applied to the probe pads 406 and pads test pads 414, 416 to identify which integrated circuits are fault free. Then a dicing process is performed in which the dies are cut from the wafer and the fault free semiconductor circuits 500 from the semiconductor substrate 102 are separated from the faulty circuits to provide a single semiconductor die circuit enclosed by the seal ring 402. The seal ring provides 402 a rectangular boundary of the four boundary edges 502, 504, 506, 508 and the interface runner regions 510, 512, 514, 516 extend to a respective boundary edge 502, 504, 506, 508.

Each fault free semiconductor circuit 500 is then further processed, at a block 650, by mounting and selectively electrically connecting the bond pads 404 to a mount with associated external package connectors. The mount and connectors are typically a lead frame including a die flag or paddle and leads, or a redistribution layer substrate with mounting pads as will be apparent to a person skilled in the art. Thereafter, sub-assemblies of lead frames or substrates and dies electrically connected to the lead frames or substrates, is enclosed in a protective housing that can be a mold compound or a hollow cover.

Advantageously, the present invention provides for concurrent parallel probe testing of an array of integrated circuits that provides for reducing the required numbers of test probes. This reduction of test probes is possible because only one test probe is required to engage a single probe pad for each of the common interconnections.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:
1. A semiconductor wafer, comprising:
a semiconductor substrate;
an array of identical integrated circuits formed on the substrate, wherein each of the circuits has a plurality of bond pads and a plurality of probe pads including at least first and second probe pads;
a plurality of seal rings, each seal ring enclosing a respective one of the integrated circuits;

a first common electrical interconnect that electrically couples together the first probe pads of the integrated circuits of the array; and a second common electrical interconnect that electrically couples together the second probe pads of the integrated circuits of the array.

2. The semiconductor wafer of claim 1, wherein the first and second probe pads are connected to first and second ones of the bond pads.

3. The semiconductor wafer of claim 1, wherein the seal ring provides a rectangular boundary of four boundary edges and the first and second common electrical interconnects include an interface runner region extending past each respective boundary edge.

4. The semiconductor wafer of claim 3, wherein each interface runner region is aligned with and coupled to an interface runner region on an adjacent one of integrated circuits.

5. The semiconductor wafer of claim 1, wherein the first common electrical interconnect electrically couples the first probe pads of the integrated circuits in series.

6. The semiconductor wafer of claim 5, wherein the first interconnects are on an active surface of each of the integrated circuits.

7. The semiconductor wafer of claim 1, wherein the first probe pads are at identical locations on each of the integrated circuits.

8. The semiconductor wafer of claim 1, wherein each of the integrated circuits has at least one probe pad coupled to one of the bond pads, wherein the probe pad is electrically isolated from all other integrated circuits.

9. A method of testing an array of identical fabricated integrated circuits formed on a semiconductor substrate, each of the integrated circuits being enclosed by a respective seal ring, wherein each of the integrated circuits has a group of bond pads and a plurality of probe pads selectively coupled to the bond pads, wherein there are common electrical interconnects that selectively electrically couple together respective ones of the probe pads on each of the integrated circuits, the method comprising:

selectively coupling test probes to the probe pads;

selectively supplying input test patterns to the test probes to thereby concurrently supply the input test patterns to all of the integrated circuits in the array; and processing output test patterns from the test probes in response to the input test patterns, wherein the output test patterns are received by one or more of the test probes to thereby determine if any of the integrated circuits are faulty.

10. The method of testing of claim 9, wherein each of the integrated circuits has at least one probe pad coupled to one of the bond pads, wherein the probe pad is electrically isolated from all of the other integrated circuits, and wherein the selectively coupling includes coupling of some of the test probes to the respective probe pads, and wherein the selectively supplying of the input test patterns to the test probes and probe pads is performed concurrently.

11. The method of testing of claim 9, wherein the processing identifies which, if any, integrated circuits are faulty.

12. The method of testing of claim 9, wherein the probe pads are at identical locations on each of the integrated circuits.

13. The method of testing of claim 9, wherein the seal ring provides a rectangular boundary of four boundary edges and the at least one common electrical interconnect includes an interface runner region extending past each respective boundary edge.

14. The method of testing as claimed in claim 13, wherein each interface runner region is aligned with and coupled to an interface runner region on an adjacent one of the integrated circuits.

15. The method of testing of claim 9, wherein the probe pads include pads for supplying the input test patterns and at least one pad for providing at least part of the output test patterns.

16. A method of assembling a packaged semiconductor die, the method including:

receiving a semiconductor wafer with an array of identical fabricated integrated circuits formed thereon, wherein each of the integrated circuits is enclosed by a respective seal ring, each of the integrated circuits has a group of bond pads and a plurality of probe pads selectively coupled to the bond pads, wherein there are common electrical interconnects on the wafer that selectively electrically couple together respective ones of the probe pads on each of the integrated circuits, and wherein each of the integrated circuits has at least one die test pad coupled to one of the bond pads, wherein the die test pad is electrically isolated from all of the other integrated circuits;

testing concurrently each of the integrated circuits with input test patterns applied to the probe pads to identify which integrated circuits are fault free;

cutting at least one of the fault free integrated circuits from the semiconductor wafer to provide a single semiconductor die enclosed by one of the seal rings;

electrically connecting the bond pads of the semiconductor die to external package connectors; and enclosing the semiconductor die in a protective housing.

17. The method of claim 16, wherein the interconnects are on an active surface of the semiconductor die.

18. The method of claim 16, wherein the seal ring provides a rectangular boundary of four boundary edges and the interconnects includes an interface runner region extending to a respective boundary edge.

19. The method of claim 16, wherein the semiconductor die includes more than one die test pad.

20. The method of claim 16, wherein the probe pads include pads for receiving the input test patterns and the test pad is a pad for providing at least part of an output test pattern.

* * * * *